(12) United States Patent
Hong

(10) Patent No.: US 9,614,038 B2
(45) Date of Patent: Apr. 4, 2017

(54) NANOWIRE DEVICE AND METHOD OF MANUFACTURING THE SAME

(71) Applicant: Semiconductor Manufacturing International (Shanghai) Corporation, Shanghai (CN)

(72) Inventor: Zhongshan Hong, Shanghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 143 days.

(21) Appl. No.: 14/495,639

(22) Filed: Sep. 24, 2014

(65) Prior Publication Data
US 2015/0295036 A1     Oct. 15, 2015

(30) Foreign Application Priority Data

Apr. 10, 2014   (CN) .......................... 2014 1 0145605

(51) Int. Cl.
*H01L 21/00*  (2006.01)
*H01L 21/84*  (2006.01)
(Continued)

(52) U.S. Cl.
CPC .......... *H01L 29/0673* (2013.01); *B82Y 10/00* (2013.01); *B82Y 40/00* (2013.01); *H01L 21/265* (2013.01); *H01L 29/413* (2013.01); *H01L 29/4232* (2013.01); *H01L 29/495* (2013.01); *H01L 29/4916* (2013.01); *H01L 29/4966* (2013.01); *H01L 29/665* (2013.01); *H01L 29/6659* (2013.01); *H01L 29/66439* (2013.01); *H01L 29/66545* (2013.01); *H01L 29/775* (2013.01); *H01L 29/78* (2013.01);
(Continued)

(58) Field of Classification Search
CPC ........... H01L 29/0673; H01L 29/78696; H01L 29/42392; H01L 29/66439; H01L 29/775; H01L 29/66545
See application file for complete search history.

(56) References Cited

U.S. PATENT DOCUMENTS 7,374,986 B2 * 5/2008 Kim .................. H01L 29/42392
                                                  257/210
8,580,624 B2 * 11/2013 Bangsaruntip ......... B82Y 10/00
                                                   257/351

(Continued)

*Primary Examiner* — Zandra Smith
*Assistant Examiner* — John M Parker
(74) *Attorney, Agent, or Firm* — Innovation Counsel LLP

(57) ABSTRACT

A method of manufacturing a nanowire device is disclosed. The method includes providing a substrate, wherein the substrate comprises a pair of support pads, a recess disposed between the support pads, a second insulating layer disposed on the support pads, a third insulating layer disposed on a bottom of the recess, and at least one nanowire suspended between the support pads at a top portion of the recess; forming a first insulating layer on the nanowire; depositing a dummy gate material over the substrate on the first insulating layer, and patterning the dummy gate material to form a dummy gate structure surrounding a channel region; forming a first oxide layer on laterally opposite sidewalls of the dummy gate; and extending the nanowire on laterally opposite ends of the channel region to the respective support pads, so as to form a source region and a drain region.

11 Claims, 10 Drawing Sheets

(51) Int. Cl.
*H01L 29/06* (2006.01)
*H01L 29/66* (2006.01)
*H01L 29/78* (2006.01)
*H01L 21/265* (2006.01)
*H01L 29/49* (2006.01)
*B82Y 10/00* (2011.01)
*B82Y 40/00* (2011.01)
*H01L 29/423* (2006.01)
*H01L 29/775* (2006.01)
*H01L 29/41* (2006.01)
H01L 21/02 (2006.01)
H01L 29/16 (2006.01)
H01L 29/20 (2006.01)

(52) U.S. Cl.
CPC .. *H01L 21/02488* (2013.01); *H01L 21/02532* (2013.01); *H01L 21/02603* (2013.01); *H01L 29/16* (2013.01); *H01L 29/20* (2013.01)

(56) References Cited

U.S. PATENT DOCUMENTS

| | | | |
|---|---|---|---|
| 2010/0193770 A1* | 8/2010 | Bangsaruntip | B82Y 10/00 257/24 |
| 2011/0133165 A1* | 6/2011 | Bangsaruntip | B82Y 10/00 257/24 |
| 2011/0133169 A1* | 6/2011 | Bangsaruntip | B82Y 10/00 257/38 |
| 2012/0138886 A1 | 6/2012 | Kuhn et al. | |
| 2014/0210013 A1* | 7/2014 | Kim | H01L 27/092 257/369 |

* cited by examiner

NANOWIRE DEVICE AND METHOD OF MANUFACTURING THE SAME

CROSS-REFERENCE TO RELATED APPLICATION

This application claims priority to Chinese Patent Application No. 201410145605.X filed on Apr. 10, 2014, the disclosure of which is incorporated herein by reference in its entirety.

BACKGROUND

Technical Field

The present disclosure relates to the field of semiconductor technology, and more particularly to a nanowire device and method of manufacturing the same.

Description of the Related Art

As the size of microelectronic devices scales below the 15 nm node, challenges in semiconductor device fabrication arise. For example, it becomes increasingly difficult to maintain/improve carrier mobility and control short channel effects with device scaling.

Nanowire devices, for example semiconductor devices having channel lengths on the nanometer scale, can provide improved carrier mobility and short channel control. For example, a germanium channel can help to increase the carrier mobility of a p-channel metal oxide semiconductor (PMOS) transistor, whereas a channel formed of a Group III-V semiconductor material can help to increase the carrier mobility of an n-channel metal oxide semiconductor (NMOS) transistor.

During the manufacture of a nanowire device, an isotropic etching process is commonly used to remove the dummy gate material below the nanowire. However, nanowire devices obtained using the isotropic etching process typically do not have consistent gate contour profiles above and below the nanowire. As a result, it may be difficult to meet specific gate contour profile requirements in the nanowire devices.

SUMMARY

The present disclosure addresses at least the above issues relating to the control of gate contour profiles in nanowire devices.

According to one embodiment of the inventive concept, a method of manufacturing a nanowire device is provided. The method includes providing a substrate, wherein the substrate comprises a pair of support pads, a recess disposed between the support pads, a second insulating layer disposed on the support pads, a third insulating layer disposed on a bottom of the recess, and at least one nanowire suspended between the support pads at a top portion of the recess; forming a first insulating layer on the nanowire; depositing a dummy gate material over the substrate on the first insulating layer, and patterning the dummy gate material to form a dummy gate structure surrounding a channel region, wherein the dummy gate structure comprises a dummy gate and the first insulating layer, and wherein the first insulating layer is disposed between the dummy gate and the channel region; forming a first oxide layer on laterally opposite sidewalls of the dummy gate; and extending the nanowire on laterally opposite ends of the channel region to the respective support pads, so as to form a source region and a drain region.

In some embodiments, patterning the dummy gate material may further include forming a hard mask layer on the dummy gate material; patterning the hard mask layer to define a gate region; and etching the dummy gate material, the nanowire, and the first insulating layer surrounding the nanowire through the patterned hard mask layer to a surface of the third insulating layer.

In some embodiments, the nanowire may include germanium or Group III-V semiconductor materials, and the dummy gate material may include polycrystalline silicon germanium (SiGe), amorphous SiGe, polycrystalline silicon, or amorphous silicon.

In some embodiments, the nanowire may include monocrystalline silicon, and the dummy gate material may include polycrystalline silicon germanium (SiGe) or amorphous SiGe.

In some embodiments, forming the first oxide layer on the laterally opposite sidewalls of the dummy gate may further include forming a second oxide layer on the laterally opposite ends of the channel region; and removing a portion of the first oxide layer and the entire second oxide layer, so as to expose the laterally opposite ends of the channel region.

In some embodiments, a thickness of the first oxide layer may be greater than a thickness of the second oxide layer.

In some embodiments, the nanowire device may include a plurality of the nanowires, and some of the nanowires may include germanium or Group III-V semiconductor materials, the remaining nanowires may include monocrystalline silicon, and the dummy gate material may include polycrystalline SiGe or amorphous SiGe.

In some embodiments, the nanowire on the laterally opposite ends of the channel region may be epitaxially doped in-situ while the nanowire is being extended to the respective support pads.

In some embodiments, forming the source region and the drain region may further include performing at least one ion implantation step after forming the source region and the drain region, wherein the ion implantation step may include forming a lightly doped drain (LDD) or a dopant implantation of the source and drain regions.

In some embodiments, the method may further include performing a self-aligned silicide process after forming the source region and the drain region, so as to form a silicide on the dummy gate, the source region, and the drain region.

In some embodiments, the method may further include forming a silicon nitride layer on respective top and bottom surfaces of the source region and the drain region, and on the laterally opposite sidewalls of the dummy gate; forming an interlayer dielectric layer over the substrate on the silicon nitride layer; performing chemical mechanical polishing to expose the dummy gate; removing the dummy gate and the first insulating layer to form a trench; and forming a gate structure.

In some embodiments, forming the gate structure may further include forming an interfacial oxide layer on a surface of the channel region; forming a high-k gate dielectric layer on the interfacial oxide layer, and on the sidewalls and bottom of the trench; forming a gate electrode to surround the channel region and cover the high-k gate dielectric layer; and performing chemical mechanical polishing to expose the gate electrode.

In some embodiments, forming the gate structure may further include forming an interfacial oxide layer on a surface of the channel region, and on the sidewalls and bottom of the trench; forming a high-k gate dielectric layer on the interfacial oxide layer; forming a gate electrode to surround the channel region and cover the high-k gate dielectric layer; and performing chemical mechanical polishing to expose the gate electrode.

According to another embodiment of the inventive concept, a nanowire device is provided. The nanowire device includes a substrate comprising a pair of support pads, a recess disposed between the support pads, a second insulating layer disposed on the support pads, a third insulating layer disposed on a bottom of the recess, and at least one nanowire suspended between the support pads at a top portion of the recess; a channel region having its top and bottom surfaces completely surrounded by a gate structure, and a source region and a drain region extending from the respective laterally opposite ends of the channel region to the support pads.

In some embodiments, the gate structure may further include a gate electrode surrounding the channel region; an interfacial oxide layer disposed between the channel region and the gate electrode; and a high-k gate dielectric layer disposed on the interfacial oxide layer, and on the sidewalls and bottom of the gate electrode.

In some embodiments, the gate structure may further include a gate electrode surrounding the channel region; an interfacial oxide layer disposed on a surface of the channel region, and on the sidewalls and bottom of the gate electrode; and a high-k gate dielectric layer disposed on the interfacial oxide layer.

In some embodiments, the nanowire may include monocrystalline silicon, germanium, or Group III-V semiconductor materials, and the gate structure may include metals, polycrystalline silicon germanium (SiGe), amorphous SiGe, polycrystalline silicon, or amorphous silicon.

In some embodiments, the nanowire device may include a plurality of the nanowires, and some of the nanowires may include germanium or Group III-V semiconductor materials, the remaining nanowires may include monocrystalline silicon, and the gate structure may include polycrystalline SiGe or amorphous SiGe.

In some embodiments, the source region and the drain region may include dopants.

In some embodiments, the nanowire device may further include a silicon nitride layer disposed on respective top and bottom surfaces of the source region and the drain region, and on laterally opposite sidewalls of the gate electrode; and an interlayer dielectric layer disposed on the silicon nitride layer.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

It is noted that in the accompanying drawings, for convenience of description, the dimensions of the components shown may not be drawn to scale. Also, same or similar reference numbers between different drawings represent the same or similar components.

FIG. 2(a) depicts a schematic cross-sectional view of a substrate;

FIG. 2(b) depicts a plan view of the substrate of FIG. 2(a);

FIG. 3 is a schematic cross-sectional view illustrating a first insulating layer being formed on the suspended nanowires on the substrate of FIG. 2(a);

FIG. 4 is a schematic cross-sectional view illustrating a dummy gate material being formed over the structure of FIG. 3;

FIG. 5(a) is a schematic cross-sectional view illustrating a dummy gate structure formed surrounding a channel region;

FIG. 5(b) is another schematic cross-sectional view of the structure of FIG. 5(a);

FIG. 6 is a schematic cross-sectional view illustrating a first oxide layer being formed on laterally opposite sidewalls of the dummy gate structure;

FIG. 7 is a schematic cross-sectional view illustrating a source region and a drain region being formed;

FIG. 8 is a schematic cross-sectional view illustrating a second oxide layer being formed on laterally opposite ends of the channel region;

FIG. 9 is a schematic cross-sectional view illustrating a portion of the first oxide layer and the entire second oxide layer being removed; and FIG. 10 is a schematic cross-sectional view illustrating a silicide being formed.

FIG. 12 is a schematic cross-sectional view illustrating a silicon nitride layer being formed;

FIG. 13 is a schematic cross-sectional view illustrating the dummy gate being exposed after chemical mechanical polishing;

FIG. 14 is a schematic cross-sectional view illustrating a trench being formed;

FIG. 15 is a schematic cross-sectional view illustrating a gate structure according to an embodiment;

and FIG. 16 is a schematic cross-sectional view illustrating a gate structure according to an another embodiment.

DETAILED DESCRIPTION

Figure 1:
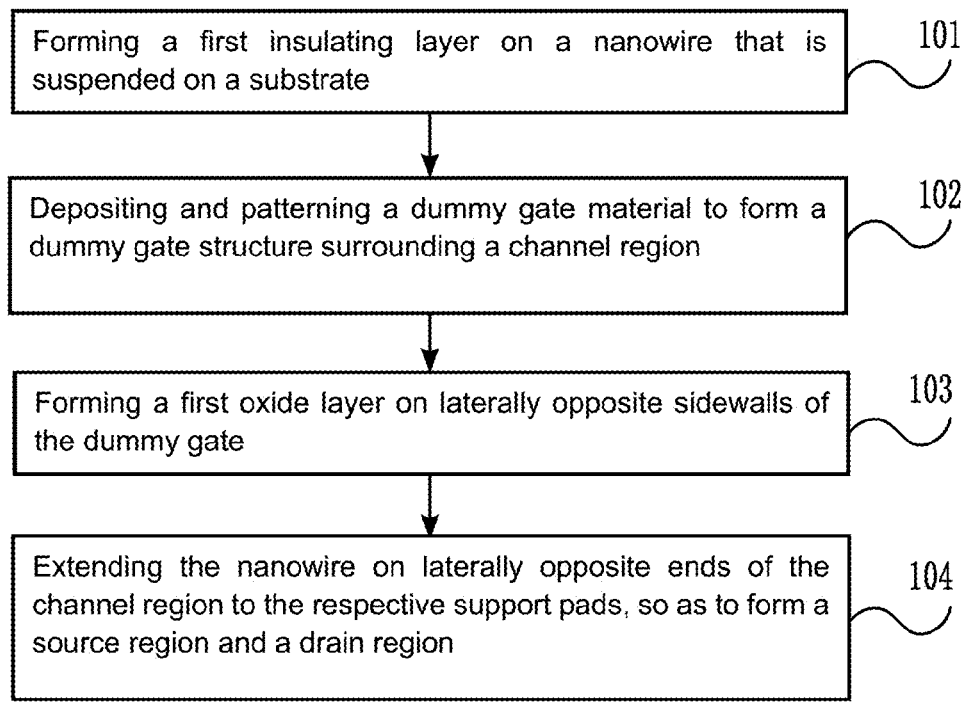
FIG. 1 is a flowchart illustrating a method of manufacturing a nanowire device according to an embodiment of the inventive concept.

Various embodiments of the inventive concept are next described in detail with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate. It should be noted that for convenience of description, the sizes of the elements in the drawings may not be drawn to scale.

In the drawings, the sizes and/or relative sizes of layers and regions may be exaggerated for clarity. Like reference numerals denote the same elements throughout.

It will be understood that, although the terms "first," "second," "third," etc. may be used herein to describe various elements, the elements should not be limited by those terms. Instead, those terms are merely used to distinguish one element from another. Thus, a "first" element discussed below could be termed a "second" element without departing from the teachings of the present inventive concept. As used herein, the term "and/or" includes any and all combinations of one or more of the associated listed items.

It should be understood that the inventive concept is not limited to the embodiments described herein. Rather, the inventive concept may be modified in different ways to realize different embodiments.

FIG. 1 is a flowchart illustrating a method of manufacturing a nanowire device according to an embodiment of the inventive concept. The steps in the exemplary method will be described with reference to FIGS. 2(a), 2(b), 3, 4, 5(a), 5(b), 6, 7, 8, 9, and 10 which depict either cross-sectional or plan views of the nanowire device at different stages of manufacture.

Figure 2A:
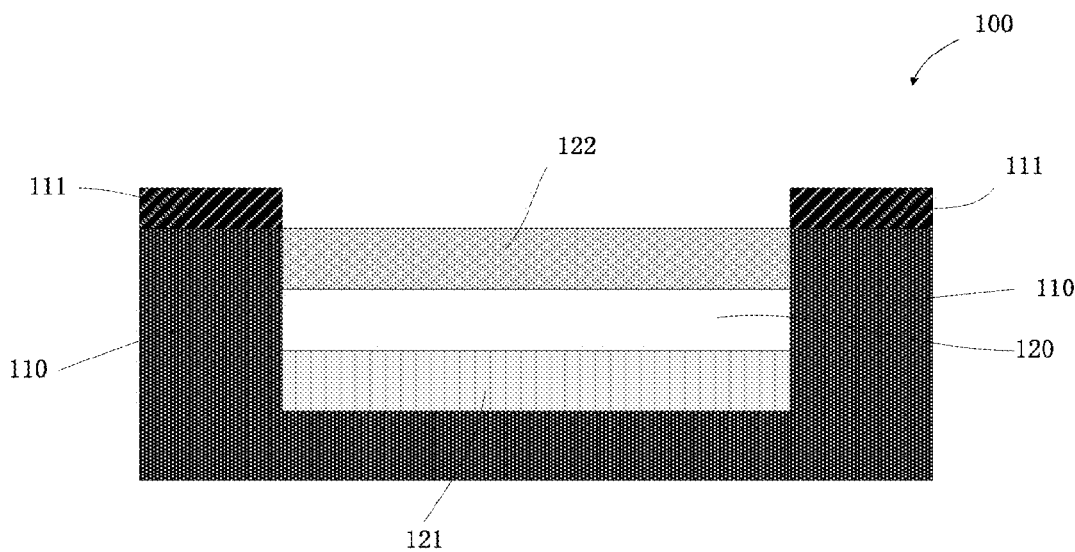
FIGS. 2(a), 2(b), 3, 4, 5(a), 5(b), 6, 7, 8, 9, and 10 depict different views of the nanowire device at different stages of manufacture according to the exemplary method of FIG. 1. Specifically.
Figure 2B:
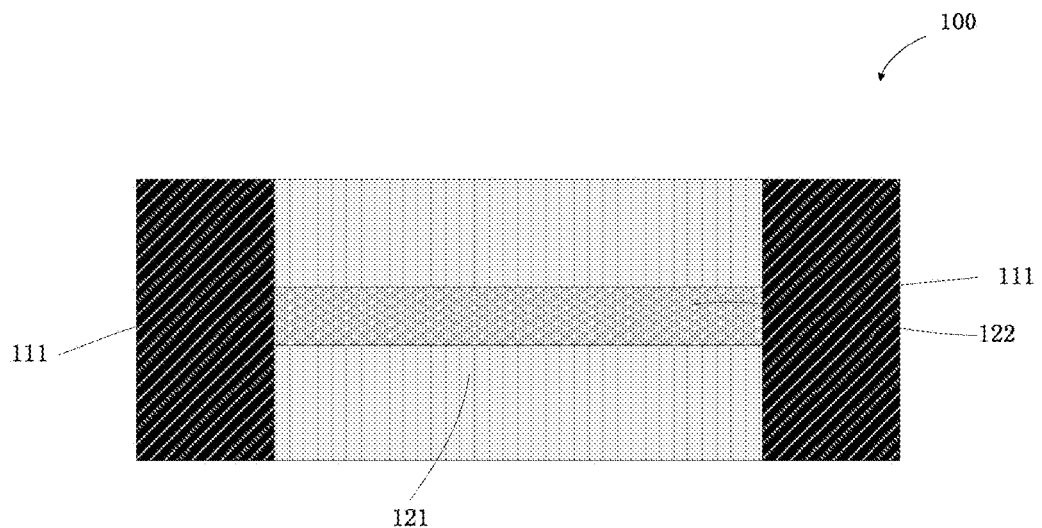

FIGS. 2(a) and 2(b) respectively depict a schematic cross-sectional view and plan view of a substrate 100 according to an embodiment. The substrate 100 may include a pair of support pads 110 and a recess 120 disposed between the support pads 110. A second insulating layer 111 is disposed on top of each support pad 110 and a third insulating layer 121 is disposed on the bottom of the recess 120. At least one nanowire 122 is formed suspended between the support pads 110 at a top portion of the recess 120. In some embodiments, the second insulating layer 111 may be a silicon nitride layer and the third insulating layer 121 may be a silicon oxide layer.

Although FIGS. 2(a) and 2(b) illustrate a single nanowire 112, the inventive concept is not limited thereto. For example, in some embodiments (not shown), the substrate 100 may include a plurality of parallel nanowires 122 formed suspended in the recess 120, so as to form a nanowire array. The nanowire array may be arranged in different configurations. For example, the nanowire array may be arranged above, below, or parallel to the nanowire 122 depicted in FIGS. 2(a) and 2(b). The nanowire array may also be arranged parallel to, and at the same height as the nanowire 122 depicted in FIGS. 2(a) and 2(b). The nanowire 122 is not limited to a cylindrical shape, but may also include other shapes.

Figure 3:
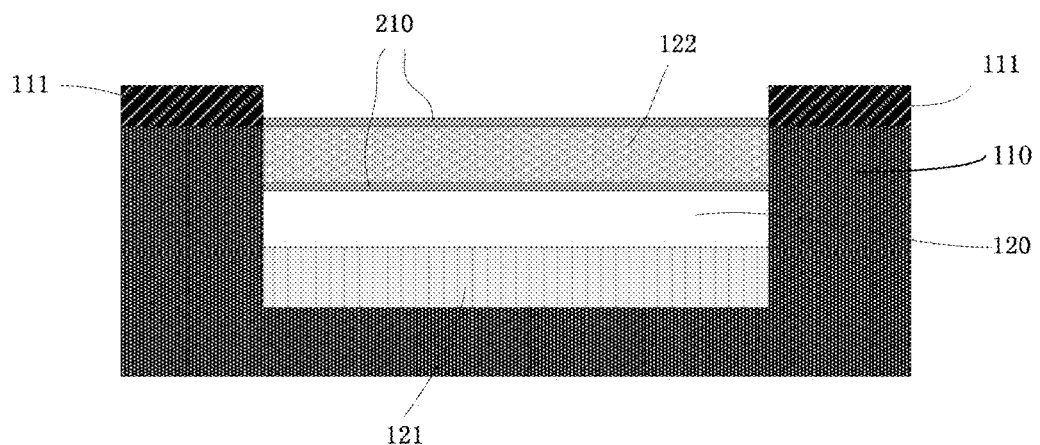

Referring to Step 101, the substrate 100 having the suspended nanowire 122 is provided, and a first insulating layer 210 is formed on the nanowire 122. The resulting structure is illustrated in FIG. 3. As shown in FIG. 3, the first insulating layer 210 may be formed on the exposed surface of the nanowire 122. The first insulating layer 210 may be formed using deposition techniques such as atomic layer deposition (ALD) or chemical vapor deposition (CVD).

Figure 4:
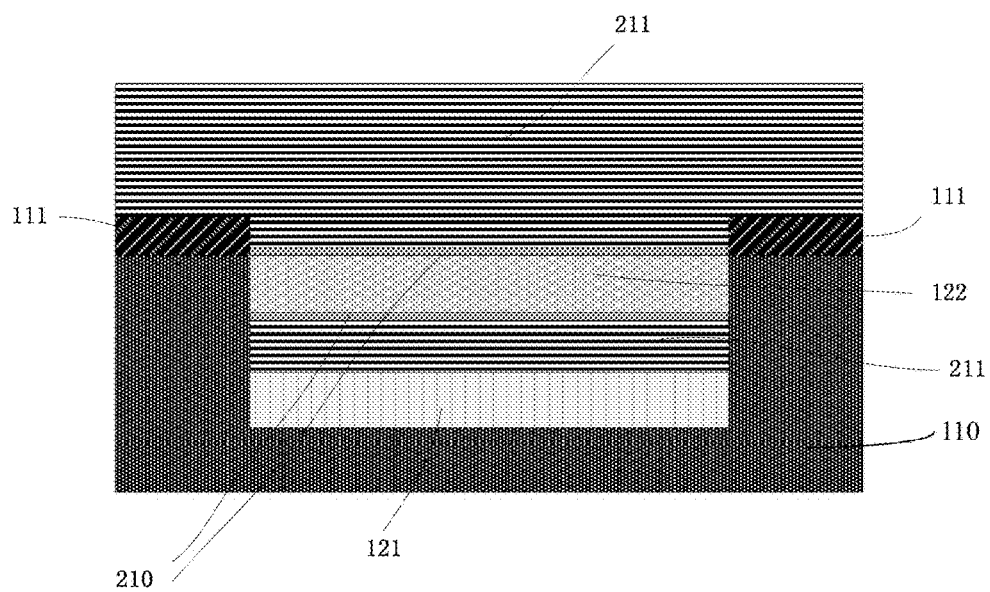
Figure 5A:
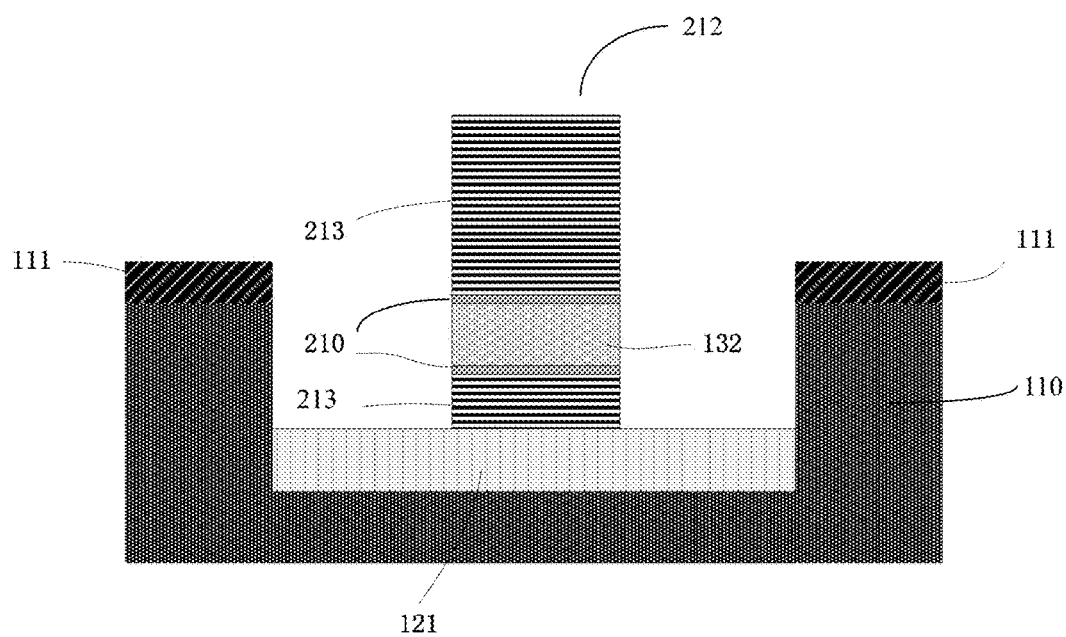
Figure 5B:
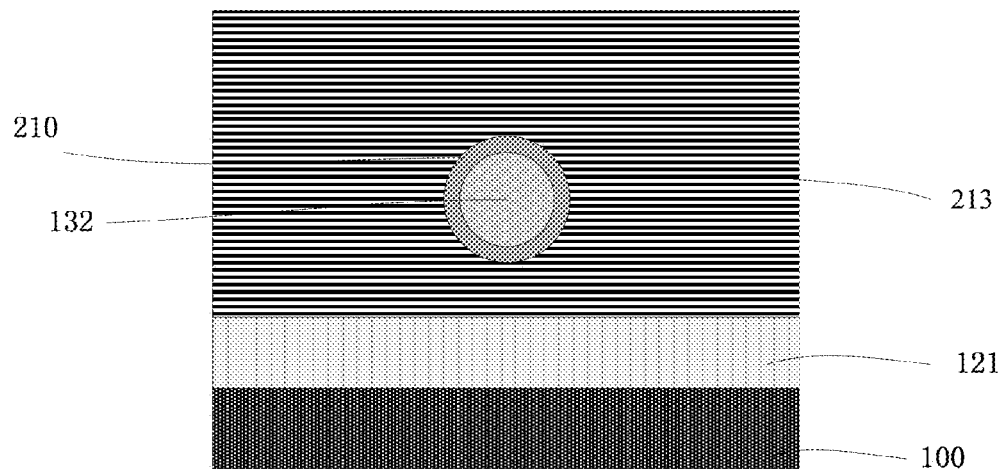

Next, referring to Step 102, a dummy gate material 211 is deposited over the substrate 100 (as shown in FIG. 4). The dummy gate material 211 is then patterned to form a dummy gate structure 212 surrounding a channel region 132. The channel region 132 consists of a portion of the nanowire 112. Specifically, FIGS. 5(a) and 5(b) are different schematic cross-sectional views illustrating the dummy gate structure 212 surrounding the channel region 132. As shown in FIGS. 5(a) and 5(b), the dummy gate structure 212 includes a dummy gate 213 and the first insulating layer 210, whereby the first insulating layer 210 is disposed between the dummy gate 213 and the channel region 132.

Figure 6:
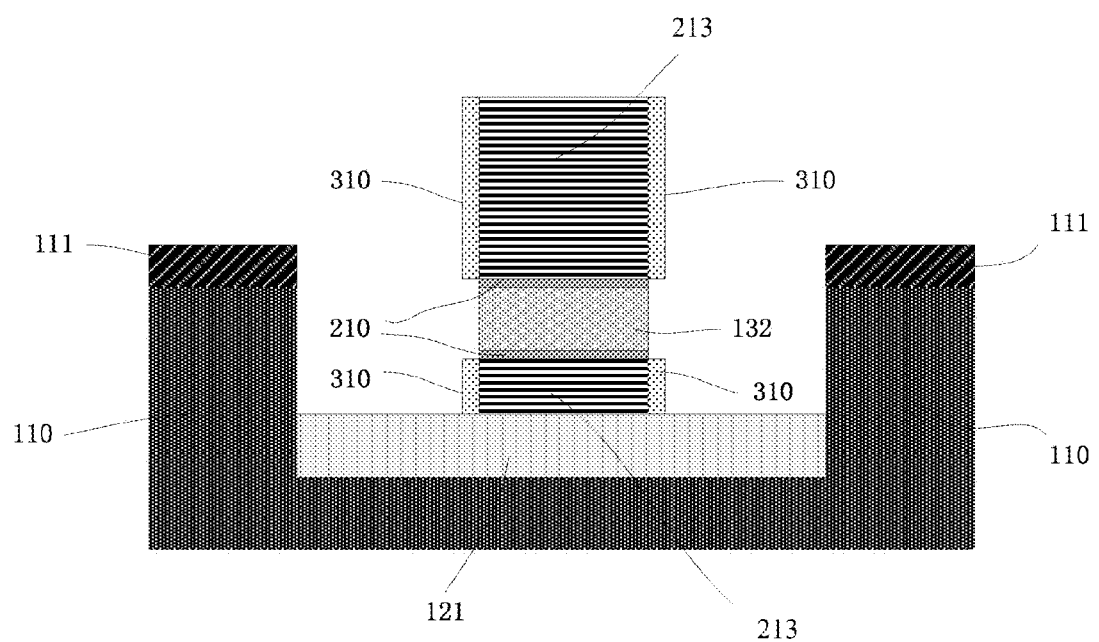

Referring to Step 103, a first oxide layer 310 is formed on laterally opposite sidewalls of the dummy gate 213 (as shown in FIG. 6). In one embodiment, the first oxide layer 310 may be a silicon oxide layer.

Figure 7:
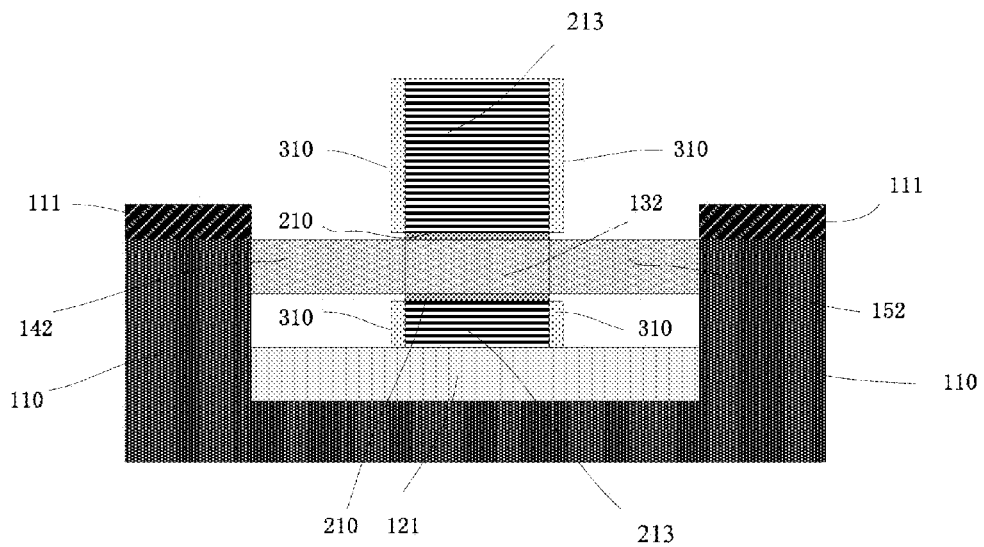

Next, referring to Step 104, the nanowire 112 on the laterally opposite ends of the channel region 132 is extended to the respective support pads 110, so as to form a source region 142 and a drain region 152 (as shown in FIG. 7). In one embodiment, the first oxide layer 310 remains after the source region 142 and the drain region 152 have been formed. In another alternative embodiment (not shown), the first oxide layer 310 may be removed after the source region 142 and the drain region 152 have been formed.

Using the exemplary method of FIG. 1, a nanowire device may be formed having a symmetric gate contour profile above and below the nanowire. Specifically, the symmetric gate contour profile above and below the nanowire can be obtained by etching/removing the portion of the nanowire lying outside of a gate region, and subsequently extending the remaining nanowire (i.e. the channel region) to form the source region and the drain region. Accordingly, specific gate contour profile requirements for different nanowire devices can be achieved using the above exemplary method.

The exemplary method is not limited to the above-described steps. In one embodiment, Step 102 (specifically the patterning of the dummy gate material 211) may be performed as follows. First, a hard mask layer (not shown) is formed on the dummy gate material 211. The hard mask layer may include silicon nitride (SiN), silicon oxide (SiO$_2$), silicon carbonitride (SiCN), etc. The hard mask layer is then patterned to define the gate region. Next, the dummy gate material 211, the nanowire 122, and the first insulating layer 210 surrounding the nanowire 122 are etched through the patterned hard mask layer to a surface of the third insulating layer 121, thereby producing the structure illustrated in FIG. 5(a). As shown in FIG. 5(a), the resulting dummy gate structure 212 is formed surrounding the channel region 132.

The nanowire 122 may include, but is not limited to, materials such as germanium or Group III-V semiconductor materials. The dummy gate material 211 may include, but is not limited to, materials such as polycrystalline silicon germanium (SiGe), amorphous SiGe, polycrystalline silicon, or amorphous silicon.

Figure 8:
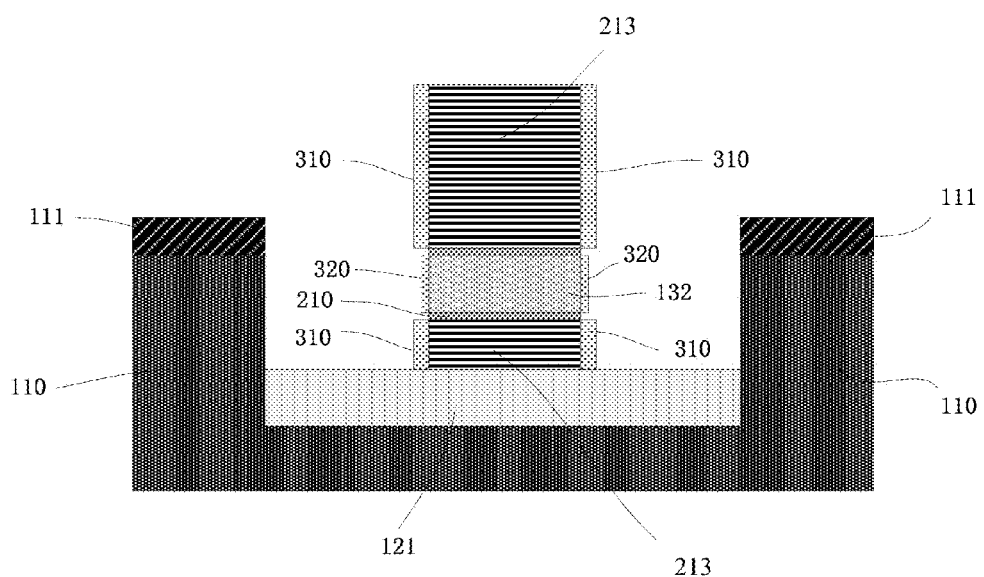
Figure 9:
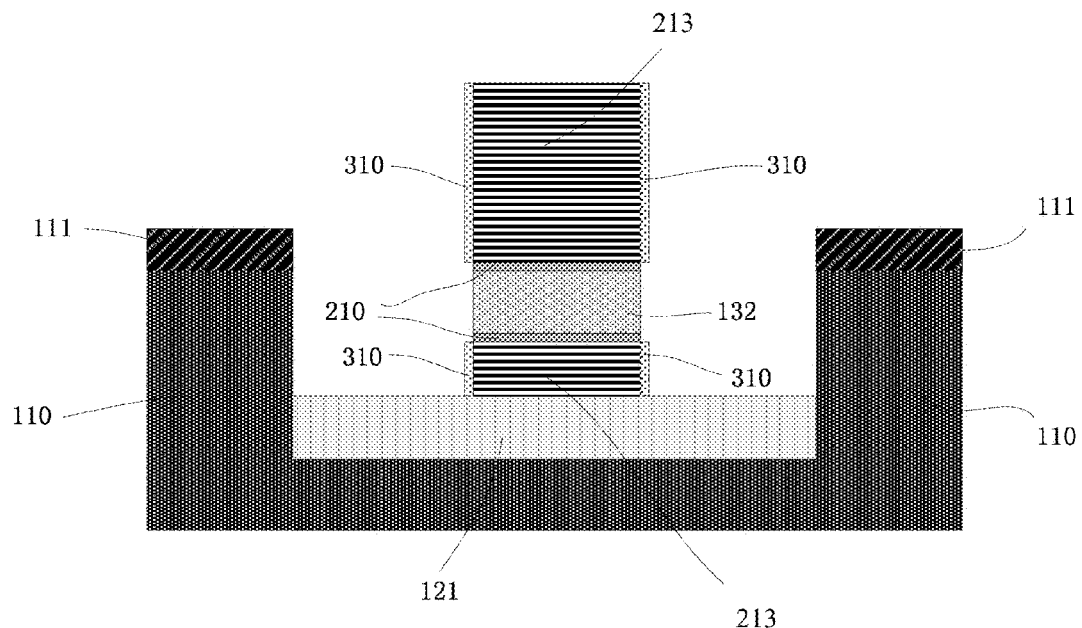

In one embodiment, Step 103 (formation of the first oxide layer 310) may further include the following steps. First, a second oxide layer 320 is formed on the laterally opposite ends of the channel region 132 (as shown in FIG. 8). A thickness of the first oxide layer 310 may be greater than a thickness of the second oxide layer 320. For example, in one embodiment, the thickness of the first oxide layer 310 may be about 1.5 times the thickness of the second oxide layer 320. In one embodiment, after the first oxide layer 310 has been formed, a wet etching process may be performed to remove a portion of the first oxide layer 310 and the entire second oxide layer 320, so as to expose the laterally opposite ends of the channel region 132 (as shown in FIG. 9).

In one embodiment, when the nanowire device includes a plurality of nanowires, the nanowires may be formed of different materials. For example, some of the nanowires may be formed of germanium or Group III-V semiconductor materials, the remaining nanowires may be formed of monocrystalline silicon, and the dummy gate material may include polycrystalline SiGe or amorphous SiGe.

In one embodiment, the nanowire at the laterally opposite ends of the channel region 132 may be epitaxially doped in-situ while nanowire is being extended to the respective support pads 110. For example, the NMOS region may be doped in-situ with a p-type dopant, while the PMOS region may be doped in-situ with an n-type dopant. However, it should be understood that the inventive concept is not limited thereto.

In one embodiment, at least one ion implantation step may be performed after forming the source region 142 and the drain region 152. The ion implantation step may include forming a lightly doped drain (LDD) and/or dopant implantation of the source/drain regions. For example, in one embodiment, the NMOS and LDD may be doped with arsenic, and the source/drain regions may be doped with phosphorus. In another embodiment, the PMOS and LDD may be doped with $BF_2^+$, and the source/drain regions may be doped with boron. However, the inventive concept is not limited thereto, and those skilled in the art would appreciate that different dopants can be selected depending on device needs.

Figure 10:
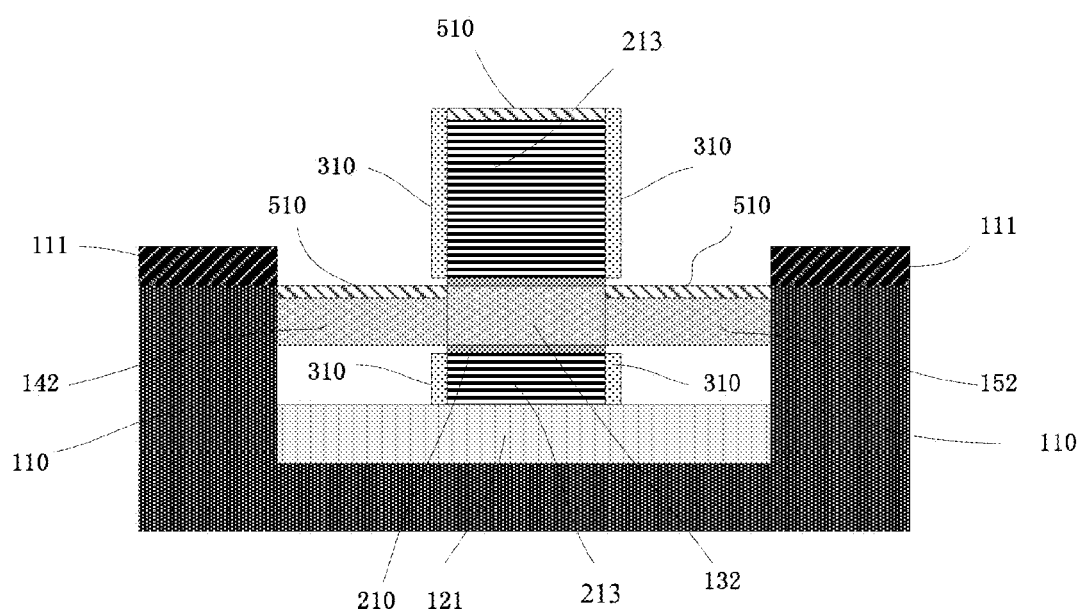

In one embodiment, a self-aligned silicide process may be performed after forming the source region 142 and the drain region 152. Specifically, a silicide 510 may be formed on the dummy gate 213, the source region 142, and the drain region 152 (as shown in FIG. 10). For example, titanium or cobalt may be deposited on the dummy gate 213, the source region 142, and the drain region 152. The titanium or cobalt is then annealed to form the self-aligned metal silicide 510. Any unsilicided metal may be subsequently removed by wet etching.

Figure 11:
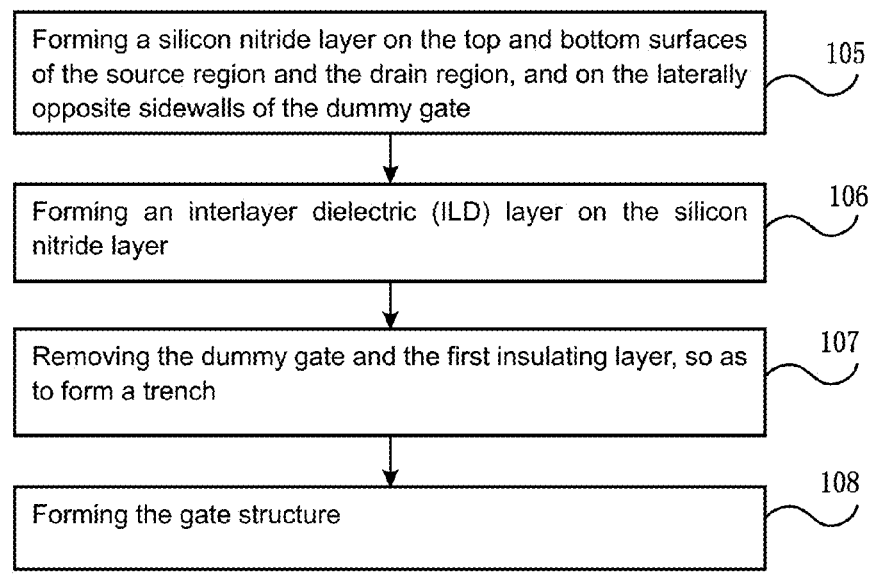
FIG. 11 is a flowchart continuing from the method of FIG. 1 according to a further embodiment of the inventive concept.

FIG. 11 is a flowchart continuing from the method of FIG. 1 according to a further embodiment of the inventive concept.

Figure 12:
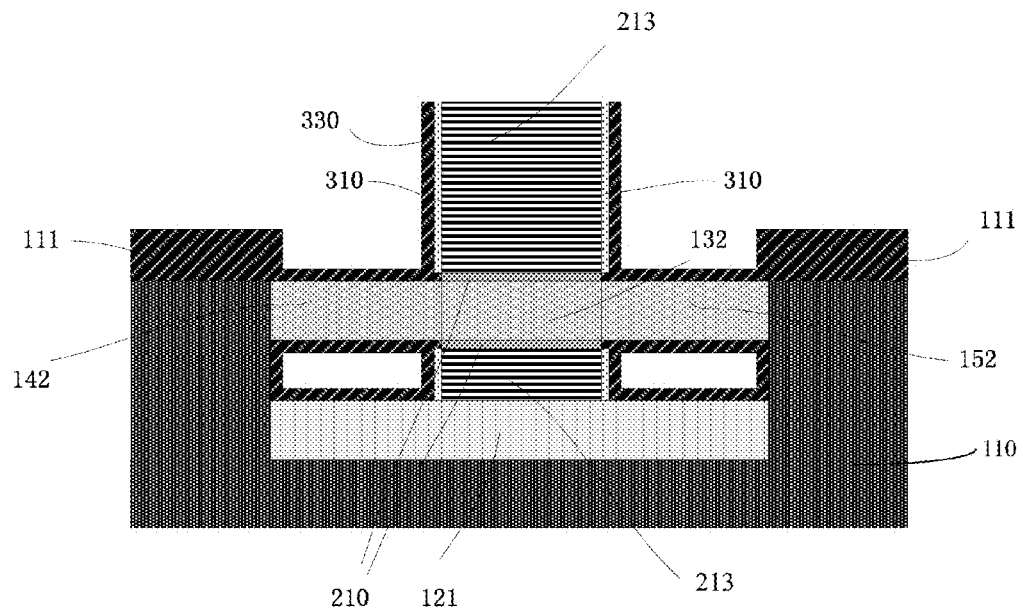
FIGS. 12, 13, 14, 15, and 16 depict different views of the nanowire device at different stages of manufacture according to the extended method of FIG. 11. Specifically.

Referring to Step 105 of FIG. 11, a silicon nitride layer 330 is formed over the substrate 100. In particular, the silicon nitride layer 330 is formed on the top and bottom surfaces of the source region 142 and the drain region 152, and on the laterally opposite sidewalls of the dummy gate 213 (as shown in FIG. 12). The silicon nitride layer 330 is also formed on the exposed surfaces of the third insulating layer 121, second insulating layer 111, and support pads 110.

Figure 13:
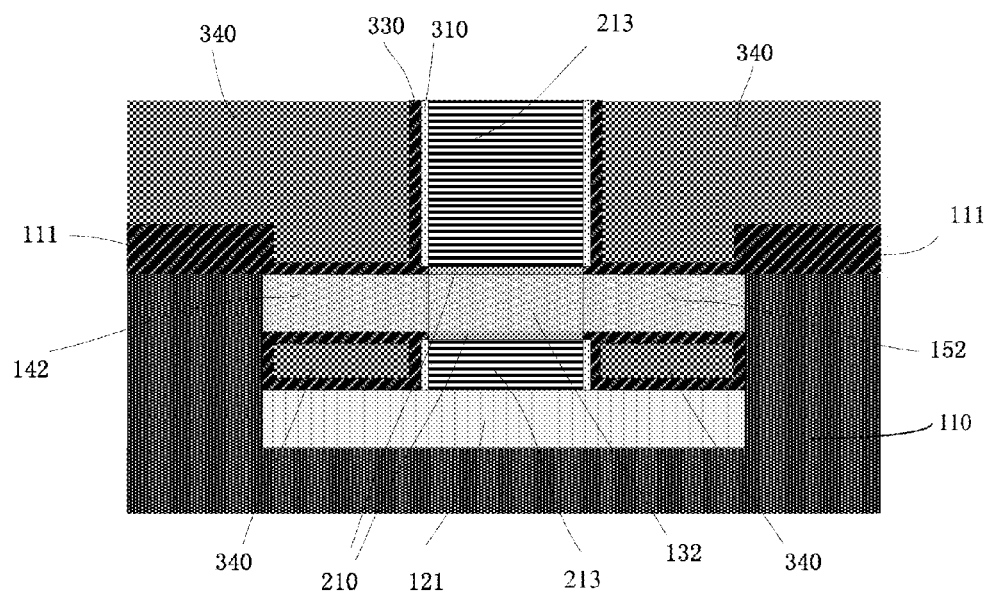

Referring to Step 106, an interlayer dielectric (ILD) layer 340 is formed on the silicon nitride layer 330 over the substrate 100. Chemical mechanical polishing is then performed to expose the dummy gate 213, thereby producing the structure illustrated in FIG. 13.

Figure 14:
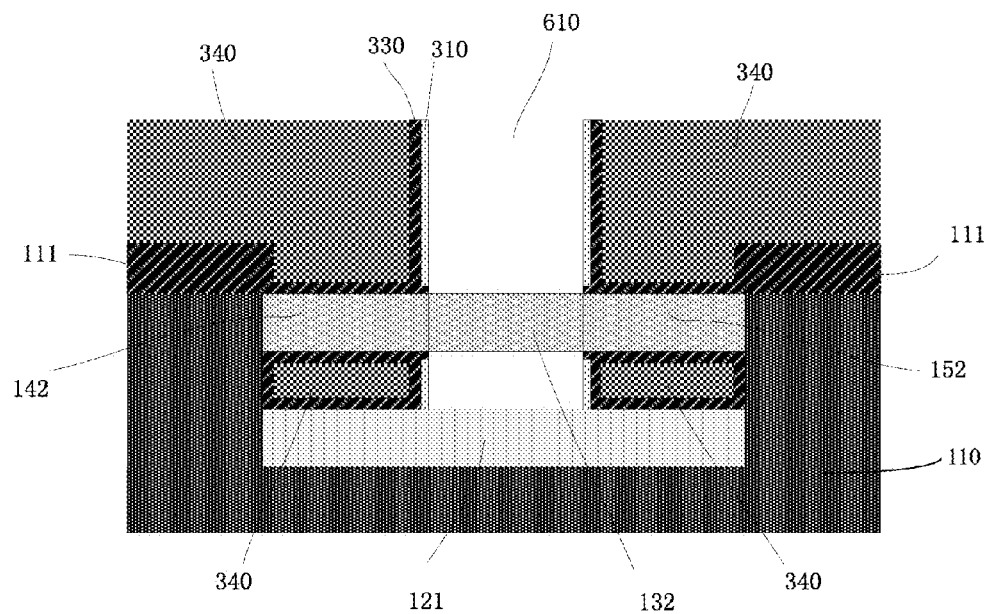

Referring to Step 107, the dummy gate 213 and the first insulating layer 210 are removed (e.g., using a dry etching process), so as to form a trench 610 (as shown in FIG. 14).

Figure 15:
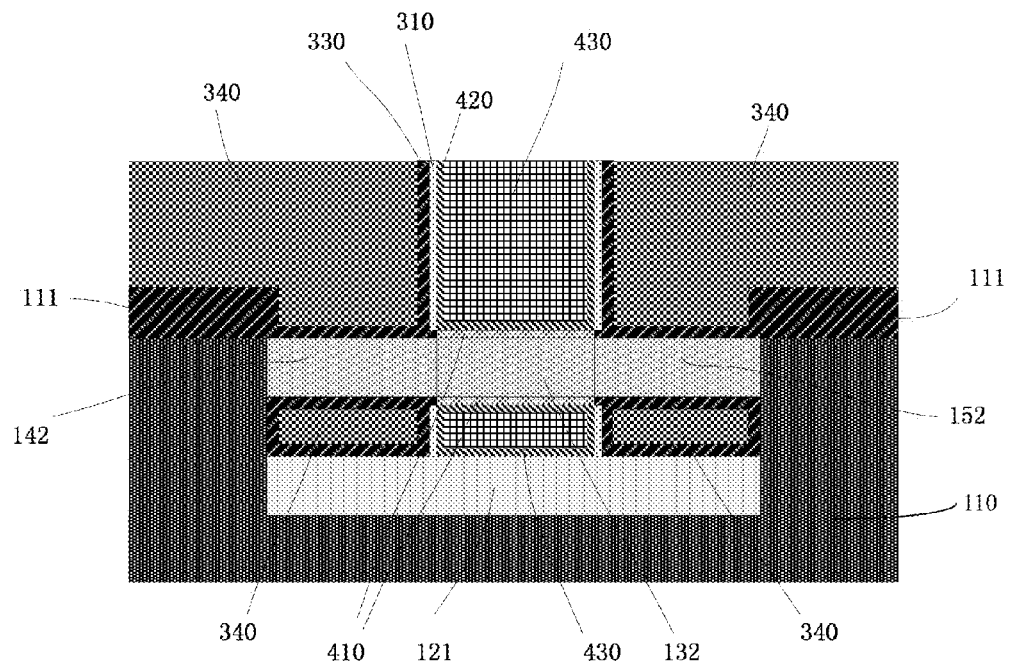

Finally, referring to Step 108, a gate structure is formed. The gate structure may be formed as follows. First, an interfacial oxide layer 410 is formed on the surface of the channel region 132. Next, a high-k gate dielectric layer 420 is formed on the interfacial oxide layer 410, and on the sidewalls and bottom of the trench 610. The high-k gate dielectric layer 420 may be formed using ALD or other deposition methods. Next, a gate electrode 430 (e.g. a metal gate) is formed surrounding the channel region 132 and covering the high-k gate dielectric layer 420. Lastly, chemical mechanical polishing is performed to expose the gate electrode 430, thereby producing the gate structure illustrated in FIG. 15.

Figure 16:
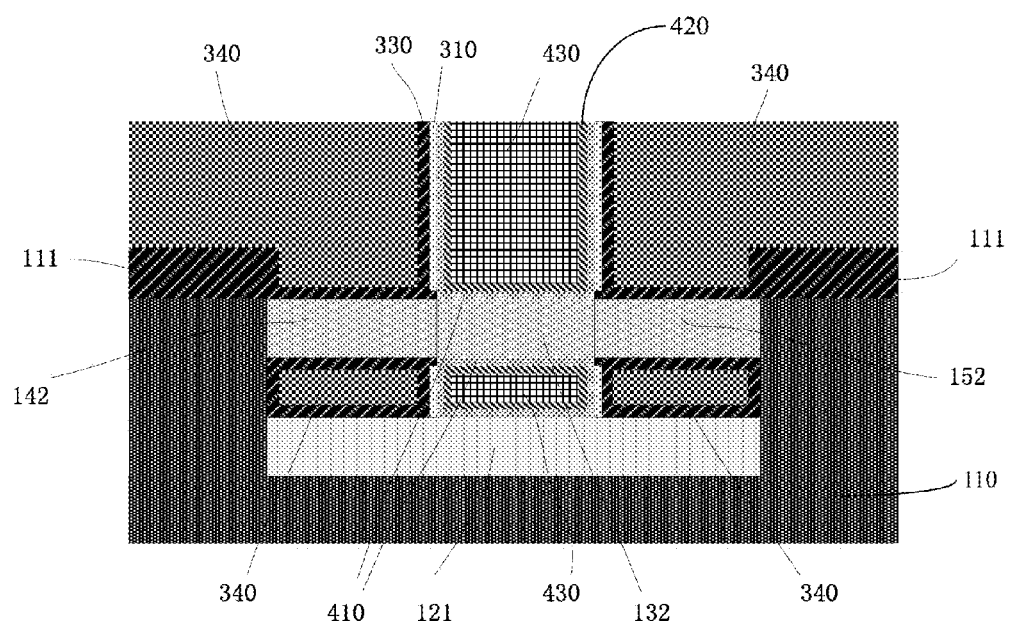

Alternatively, the gate structure may be formed using the following method. First, the interfacial oxide layer 410 is formed on the surface of the channel region 132, and on the sidewalls and bottom of the trench 610. Next, the high-k gate dielectric layer 420 is formed on the interfacial oxide layer 410. Next, the gate electrode 430 (e.g. a metal gate) is formed surrounding the channel region 132 and covering the high-k gate dielectric layer 420. Lastly, chemical mechanical polishing is performed to expose the gate electrode 430, thereby producing the gate structure illustrated in FIG. 16.

In one embodiment, the interfacial oxide layer 410 may include $SiO_2$; the high-k gate dielectric layer 420 may include hafnium oxide, aluminum oxide, tantalum oxide, titanium oxide, or zirconium oxide; and the gate electrode 430 may be a metal gate.

Figure 17:
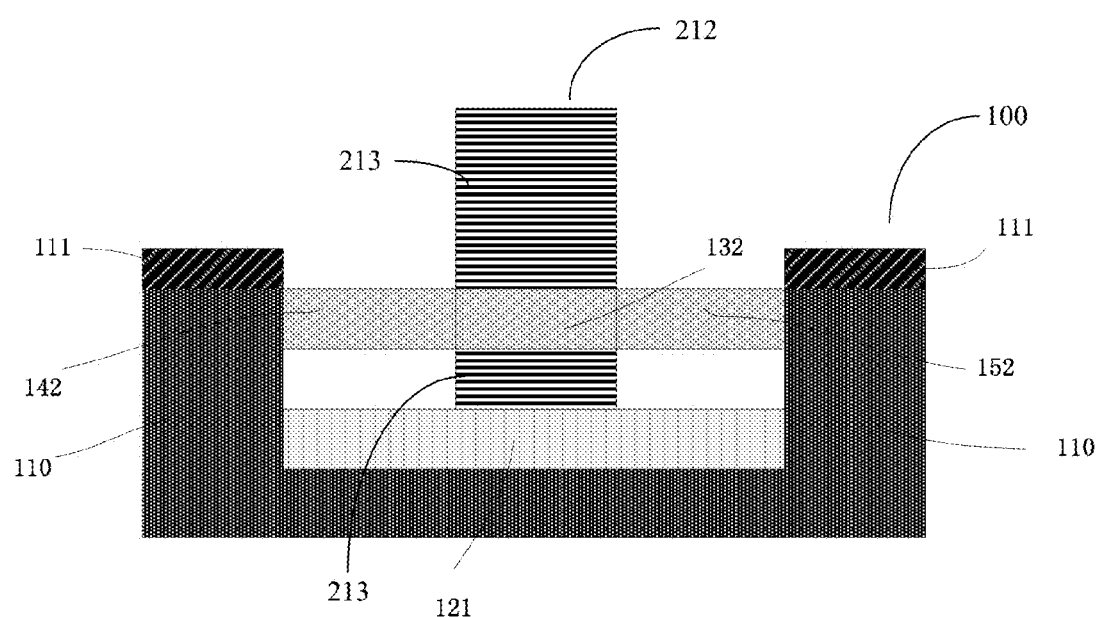
FIG. 17 is a schematic cross-sectional view illustrating a nanowire device according to an embodiment.

FIG. 17 is a schematic cross-sectional view illustrating a nanowire device according to an embodiment. The nanowire device may be manufactured using some or all of the process steps previously described with reference to FIGS. 1, 2(*a*), 2(*b*), 3, 4, 5(*a*), 5(*b*), 6, 7, 8, 9, 10, 11, 12, 13, 14, 15, and 16.

Referring to FIG. 17, the nanowire device includes a substrate 100. The substrate 100 includes a pair of support pads 110 and a recess 120 disposed between the support pads 110, a second insulating layer 111 disposed on top of each support pad 110, and a third insulating layer 121 is disposed on the bottom of the recess 120.

The nanowire device further includes a channel region 132 having its top and bottom surfaces completely surrounded by a dummy gate 213, and a source region 142 and a drain region 152 extending from the respective laterally opposite ends of the channel region 132 to the support pads 110. The channel region 132, source region 142, and drain region 152 may be formed of one or more nanowires.

Referring back to FIG. 15, the gate structure in a nanowire device according to an embodiment of the inventive concept may include the gate electrode 430 surrounding the channel region 132; the interfacial oxide layer 410 disposed between the channel region 132 and the gate electrode 430; and the high-k gate dielectric layer 420 disposed on the interfacial oxide layer 410, and on the sidewalls and bottom of the gate electrode 430.

Referring back to FIG. 16, the gate structure in a nanowire device according to another embodiment of the inventive concept may include the gate electrode 430 surrounding the channel region 132; the interfacial oxide layer 410 disposed on the surface of the channel region 132, and on the sidewalls and bottom of the gate electrode 430; and the high-k gate dielectric layer 420 disposed on the interfacial oxide layer 410.

In one embodiment of the nanowire device, the nanowire may include materials such as germanium or Group III-V semiconductor materials. The gate material may include materials such as metals, polycrystalline silicon germanium (SiGe), amorphous SiGe, polycrystalline silicon, or amorphous silicon.

In another embodiment of the nanowire device, the nanowire may include monocrystalline silicon. The gate material may include materials such as metals, polycrystalline silicon germanium (SiGe), or amorphous SiGe.

In a further embodiment, when the nanowire device includes a plurality of nanowires, the nanowires may be formed of different materials. For example, some of the nanowires may be formed of germanium or Group III-V semiconductor materials, the remaining nanowires may be formed of monocrystalline silicon, and the gate material may include metals, polycrystalline SiGe, or amorphous SiGe.

In one embodiment of the nanowire device, the source region 142 and the drain region 152 include dopants. Those skilled in the art would appreciate that different dopants can be selected depending on device needs.

In some embodiments (for example, referring to FIG. 15 or 16), the nanowire device may further include a silicon nitride layer 330 disposed on the top and bottom surfaces of the source region 142 and the drain region 152, and on the laterally opposite sidewalls of the gate electrode 430; and an interlayer dielectric (ILD) layer 340 disposed on the silicon nitride layer 330.

Embodiments of a nanowire device and methods of manufacturing the nanowire device have been described in the foregoing description. To avoid obscuring the inventive concept, details that are well-known in the art may have been omitted. Nevertheless, those skilled in the art would be able to understand the implementation of the inventive concept and its technical details in view of the present disclosure.

The different embodiments of the inventive concept have been described with reference to the accompanying drawings. However, the different embodiments are merely illustrative and are not intended to limit the scope of the inventive concept. Furthermore, those skilled in the art would appreciate that various modifications can be made to the different embodiments without departing from the scope of the inventive concept.

What is claimed is:

1. A method of manufacturing a nanowire device, comprising:
    providing a substrate, wherein the substrate comprises a pair of support pads, a recess disposed between the support pads, a second insulating layer disposed on the support pads, a third insulating layer disposed on a bottom of the recess, and at least one nanowire suspended between the support pads at a top portion of the recess;
    forming a first insulating layer on the nanowire;
    depositing a dummy gate material over the substrate on the first insulating layer, and patterning the dummy gate material to form a dummy gate structure surrounding a channel region, wherein the dummy gate structure comprises a dummy gate and the first insulating layer, and wherein the first insulating layer is disposed between the dummy gate and the channel region;
    forming a first oxide layer on laterally opposite sidewalls of the dummy gate;
    forming a second oxide layer on laterally opposite ends of the channel region, wherein the thickness of the first oxide layer is greater than the thickness of the second oxide layer;
    removing a portion of the first oxide layer and the entire second oxide layer, so as to expose the laterally opposite ends of the channel region; and
    extending the nanowire on the laterally opposite ends of the channel region to the respective support pads, so as to form a source region and a drain region.

2. The method according to claim 1, wherein patterning the dummy gate material further comprises:
    forming a hard mask layer on the dummy gate material;
    patterning the hard mask layer to define a gate region; and
    etching the dummy gate material, the nanowire, and the first insulating layer surrounding the nanowire through the patterned hard mask layer to a surface of the third insulating layer.

3. The method according to claim 2, wherein the nanowire includes germanium or Group III-V semiconductor materials, and
    the dummy gate material includes polycrystalline silicon germanium (SiGe), amorphous SiGe, polycrystalline silicon, or amorphous silicon.

4. The method according to claim 2, wherein the nanowire includes monocrystalline silicon, and
    the dummy gate material includes polycrystalline silicon germanium (SiGe) or amorphous SiGe.

5. The method according to claim 2, wherein the nanowire device includes a plurality of the nanowires, and
    some of the nanowires include germanium or Group III-V semiconductor materials, the remaining nanowires include monocrystalline silicon, and the dummy gate material includes polycrystalline SiGe or amorphous SiGe.

6. The method according to claim 2, wherein the nanowire on the laterally opposite ends of the channel region is epitaxially doped in-situ while the nanowire is being extended to the respective support pads.

7. The method according to claim 2, wherein forming the source region and the drain region further comprises:
    performing at least one ion implantation step after forming the source region and the drain region, wherein the ion implantation step includes forming a lightly doped drain (LDD) or a dopant implantation of the source and drain regions.

8. The method according to claim 1, further comprising:
    performing a self-aligned silicide process after forming the source region and the drain region, so as to form a silicide on the dummy gate, the source region, and the drain region.

9. The method according to claim 1, further comprising:
    forming a silicon nitride layer on respective top and bottom surfaces of the source region and the drain region, and on the laterally opposite sidewalls of the dummy gate;
    forming an interlayer dielectric layer over the substrate on the silicon nitride layer;
    performing chemical mechanical polishing to expose the dummy gate;
    removing the dummy gate and the first insulating layer to form a trench; and
    forming a gate structure.

10. The method according to claim 9, wherein forming the gate structure further comprises:
    forming an interfacial oxide layer on a surface of the channel region;
    forming a high-k gate dielectric layer on the interfacial oxide layer, and on the sidewalls and bottom of the trench;
    forming a gate electrode to surround the channel region and cover the high-k gate dielectric layer; and
    performing chemical mechanical polishing to expose the gate electrode.

11. The method according to claim 9, wherein forming the gate structure further comprises:
    forming an interfacial oxide layer on a surface of the channel region, and on the sidewalls and bottom of the trench;
    forming a high-k gate dielectric layer on the interfacial oxide layer;
    forming a gate electrode to surround the channel region and cover the high-k gate dielectric layer; and
    performing chemical mechanical polishing to expose the gate electrode.

* * * * *